(12) United States Patent
Woodbury et al.

(10) Patent No.: US 7,098,103 B2
(45) Date of Patent: Aug. 29, 2006

(54) METHOD AND STRUCTURE FOR NON-SINGLE-POLYCRYSTALLINE CAPACITOR IN AN INTEGRATED CIRCUIT

(75) Inventors: Dustin A. Woodbury, Indian Harbour Beach, FL (US); Robert J. Kinzig, Melbourne, FL (US); James Douglas Beasom, Melbourne Village, FL (US); Timothy A. Valade, Melbourne, FL (US); Donald F. Hemmenway, Melbourne, FL (US); Kitty Elshot, Orlando, FL (US)

(73) Assignee: Intersil Americas, Inc., Milpitas, CA (US)

( * ) Notice: Subject to any disclaimer, the term of this patent is extended or adjusted under 35 U.S.C. 154(b) by 110 days.

(21) Appl. No.: 10/798,559

(22) Filed: Mar. 12, 2004

(65) Prior Publication Data

US 2005/0202629 A1    Sep. 15, 2005

(51) Int. Cl.
*H01L 21/8242* (2006.01)

(52) U.S. Cl. .................................... 438/250

(58) Field of Classification Search ............... None
See application file for complete search history.

(56) References Cited

U.S. PATENT DOCUMENTS

| | | | | |
|---|---|---|---|---|
| 5,110,752 A | * | 5/1992 | Lu | 438/398 |
| 5,126,280 A | * | 6/1992 | Chan et al. | 438/253 |
| 5,166,090 A | * | 11/1992 | Kim et al. | 438/253 |
| 5,173,437 A | * | 12/1992 | Chi | 438/253 |
| 5,262,343 A | * | 11/1993 | Rhodes et al. | 438/3 |
| 5,550,077 A | * | 8/1996 | Tseng et al. | 438/396 |
| 6,420,222 B1 | * | 7/2002 | Watanabe | 438/201 |

* cited by examiner

*Primary Examiner*—Thao P. Le
(74) *Attorney, Agent, or Firm*—Barnes & Thornburg LLP

(57) ABSTRACT

A method of forming a non-single-crystalline capacitor in an integrated circuit. It includes the steps of forming a first non-single-crystalline layer on a gate dielectric layer of a substrate of an integrated circuit. Next, a capacitor dielectric layer is formed on the first non-single-crystalline layer, and a second non-single-crystalline layer is formed on the capacitor dielectric layer. Portions of the second non-single-crystalline layer are removed to define a top plate of the capacitor. Portions of the capacitor dielectric layer are removed to define a dielectric of the capacitor. Also, portions of the first non-single-crystalline layer are removed to define the bottom plate of the capacitor.

5 Claims, 2 Drawing Sheets

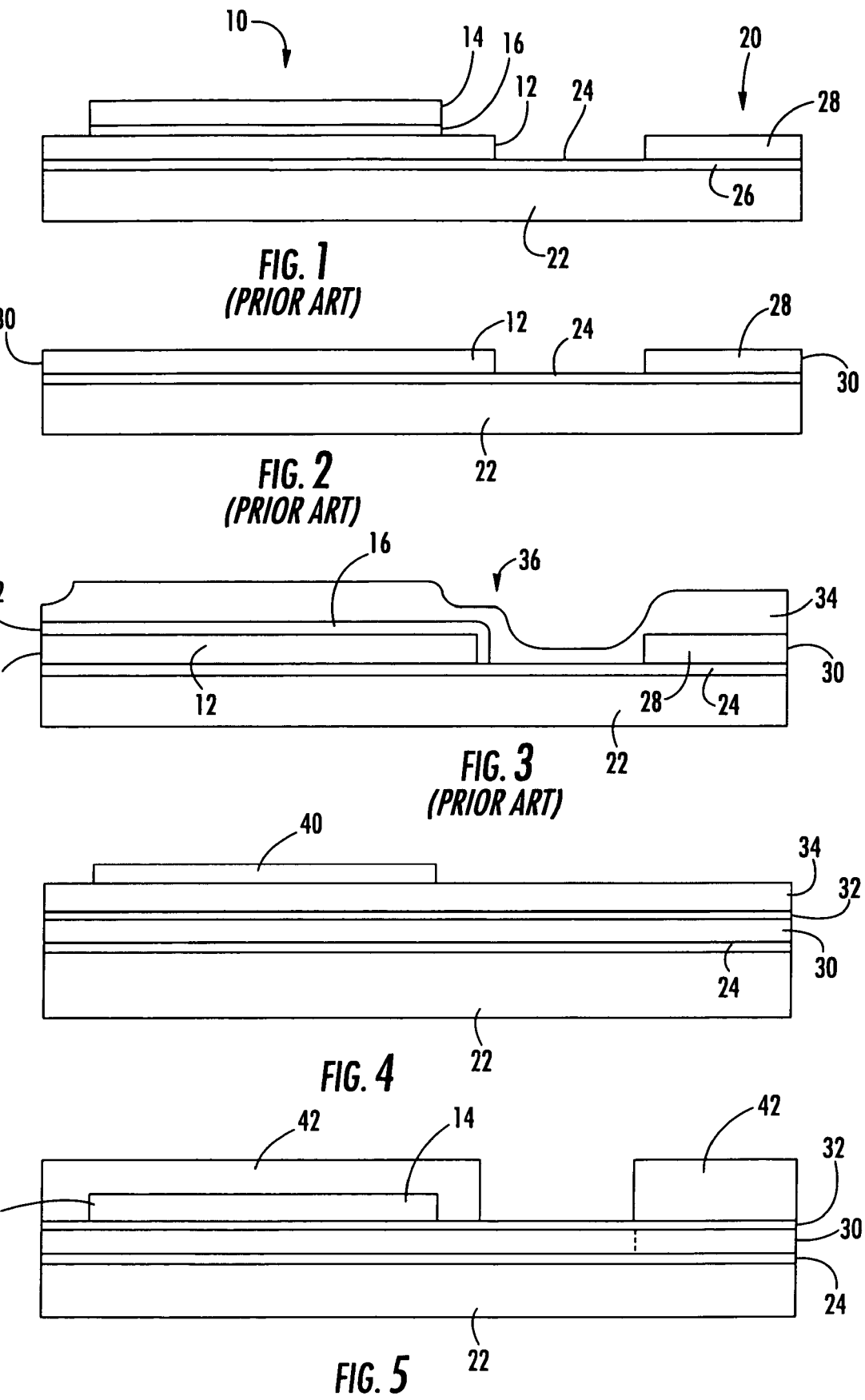

METHOD AND STRUCTURE FOR NON-SINGLE-POLYCRYSTALLINE CAPACITOR IN AN INTEGRATED CIRCUIT

BACKGROUND AND SUMMARY OF THE DISCLOSURE

The present disclosure relates to the formation of capacitors in integrated circuits and, more specifically, the formation of non-single-crystalline-plated capacitors in integrated circuits. As used herein, non-single-crystalline material includes polycrystalline, amorphous and/or alloys of, for example, silicon and germanium. It specifically excludes metals.

Presently, polycrystalline-plated capacitors have been integrated in integrated circuits with field effect transistors (FETs), specifically, MOS FETs. Such a structure is illustrated in FIG. 1 and made by the general process of FIGS. 1-3 to be discussed below. Generally, the polycrystalline layer used to form the gate of the MOS transistors is also used to form the bottom plate of the polycrystalline capacitor. Typically, the bottom plate is patterned first and left exposed. Thus, its upper surface is exposed to various cleaning and photo-resist steps in the process flow. Also, the dielectric layer or layers used to form the dielectric of the capacitor is also exposed to various cleaning and photo-resist operations. The roughening of the surface of the first polycrystalline layer's upper surface, as well as the surface of the dielectric of the capacitor, effects the ultimate yield of the number of acceptable structures.

It has been suggested to use several dielectric layers, such as silicon dioxide and combinations of silicon and nitride, to protect the top surface of the bottom plate or first dielectric plate. This adds expense to the process.

Another limitation on the formation of the polycrystalline plate capacitor of FIG. 1 is the formation of stringers, which are regions of unetched polycrystalline material left adjacent to side walls of bottom plate steps which can result in unintended connections between polycrystalline structures. This results from the second polycrystalline layer conforming to steps in the first polycrystalline layer due to pre-patterning of the first layer making the second layer difficult to clear. To minimize the formation of stringers, the etching process to remove the top polycrystalline layer and form the top plate must be performed considerably longer than would be necessary for a planar layer in order to remove the additional polycrystalline thickness at the edges of the patterned or defined first polycrystalline plate. This additional etching also affects the surfaces that are subsequently exposed during the etching process. These include, for example, the surface dielectric covering the substrate in which the other elements of the integrated circuit, such as MOS FETs, are formed.

Metal plate capacitors have also been formed on integrated circuits. These capacitors have been formed at the interconnect level on the dielectric covering the elements of the integrated circuit. In this process, the bottom plate metallic layer, the capacitor dielectric layer and the top metal plate layer are formed. The top plate layer is then patterned, followed by patterning of the dielectric and the bottom plate layer. This process solves the problem of over-etching required by the step coverage. Also, because of the difference of materials, the etchings can be more selective to etch the metals versus the capacitor dielectric layer and the dielectric layer protecting the integrated circuit in a polycrystalline process. The physical displacement from the surface of the substrate in which integrated elements are formed also does not require the same care in the metal plate capacitor process as in the polycrystalline capacitor process.

The capacitor is typically built on thicker field oxide, but the etch used to pattern the top layer attacks the substrate gate oxide extending from the edges of the MOS FETs, which is typically a thin insulative layer. This thin oxide is also the gate oxide and etch damage to it could adversely affect the performance of the MOS FETs, as well as the polycrystalline capacitors.

The present disclosure is directed to a method of forming non-single-crystalline capacitor in an integrated circuit. It includes the steps of forming a first non-single-crystalline layer on a gate dielectric layer of a substrate of an integrated circuit. Next, a capacitor dielectric layer is formed on the first non-single-crystalline layer, and a second non-single-crystalline layer is formed on the capacitor dielectric layer. Portions of the second non-single-crystalline layer are removed to define a top plate of the capacitor. Portions of the capacitor dielectric layer are removed to define a dielectric of the capacitor. Also, portions of the first non-single-crystalline layer are removed to define the bottom plate of the capacitor. By forming all three layers of the capacitor sequentially, preferably without any other intervening process steps, the surfaces between the non-single-crystalline plate layers and the dielectric layer are as defect-free as possible.

Removing portions of the first non-single-crystalline layer also simultaneously defines a gate of a transistor of the integrated circuit. Removing portions of the various layers are performed using masks with openings and etching-exposed material through the openings. Various combinations of masks may be used to etch the three layers, including a common mask for the dielectric and one of the non-single-crystalline layers.

These and other aspects of the present disclosure will become apparent from the following detailed description of the disclosure, when considered in conjunction with accompanying drawings.

BRIEF DESCRIPTION OF DRAWINGS

FIG. 1 is a cross-section of an integrated circuit after the formation of the polycrystalline capacitor according to the prior art.

FIGS. 2 and 3 are cross-sections at various stages of the process of forming the capacitor of FIG. 1 according to the prior art.

FIGS. 4–6 are cross-sections of an integrated circuit during different stages of manufacturing according to one embodiment of the present disclosure.

DETAILED DESCRIPTION OF THE PREFERRED EMBODIMENTS

Figure 6:
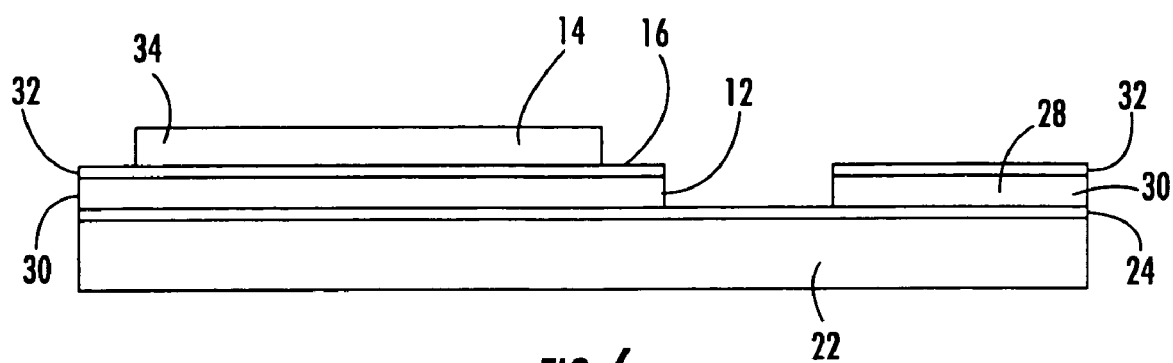

The integrated circuit of the prior art is illustrated in FIG. 1 as including a polycrystalline capacitor 10 and a field effect transistor (FET) 20. The capacitor 10 includes a bottom polycrystalline plate 12 separated from a top polycrystalline plate 14 by a dielectric layer 16. It is common for oxide 24 under the bottom plate 12 to be thicker than the gate oxide 26. The bottom plate 12 is separated from a substrate 22 by a dielectric layer 24. A portion of the dielectric layer 24 between the substrate 22 and the gate 28 of the FET 20 is denoted as gate oxide or dielectric 26. The source, drains and other elements of the FET 20 are not shown within the substrate 22 for sake of clarity. Also, the metallization layer to each of these devices is not shown. The bottom plate 12 and the polycrystalline gate 28 are derived from the same polycrystalline layer in the process. As is well known, the plates 12, 14 and gate 28 are polycrystalline layers which are doped with appropriate impurities to increase their conductivity.

The process of the prior art of forming the integrated circuit of FIG. 1 is illustrated in FIGS. 2 and 3. A first polycrystalline layer 30 is applied onto the oxide layer 24 of the substrate 22. It is patterned through masking and etching to create the bottom plate 12 of the capacitor 10 and the gate 28 of the FET 20. Further processing is performed on the integrated circuit, including other photo-resist cleaning and masking steps. For example, these may include forming doped regions within the substrate 22, as is well known. Subsequent to the other steps, the capacitor dielectric layer 32 is applied, resulting in the capacitor dielectric 16 illustrated in FIG. 3. Again, further processing is performed, such as photo-resist removal and wet cleaning processes, on the layer 32. Finally, a polycrystalline layer 34 is applied to the delineated capacitive dielectric 16, the first polycrystalline plate 12 and the polycrystalline gate 30.

As will be noted, the step region 36 at the edge of the first plate 12 and gate 28 is thicker than the remaining thickness of layer 34. In order to ensure no stringers, due to the step 36, layer 34 must be over-etched. During the etching, the protective oxide layer 24 would be detrimentally affected, as well as possibly the capacitor dielectric 16. This would affect the breakdown voltage of the capacitor 10, as well as the characteristics of the FET 20.

The process of the present disclosure is directed to addressing these issues. As illustrated in FIG. 4, the first polycrystalline layer 30, the capacitor dielectric 32 and the top polycrystalline layer 34 are applied across the substrate 22. A first masking material 40 is then applied. Dielectric 32 can be partially or fully grown on bottom plate layer 34 or deposited using oxide or nitride, singly or in any combination. The integrated circuit is then etched to form the resulting top plate region 14, as illustrated in FIG. 5. It should be noted that the first polycrystalline layer 30 and the second polycrystalline layer 34 may be doped after their deposition by open tube deposition or ion implantation. Alternatively, they may be deposited and doped simultaneously by in-situ doping.

Next, a second mask 42 is formed on the defined top plate 14 with an opening exposing the dielectric layer 32. The dielectric layer 32 is then etched to define the capacitor dielectric. Next, the first polycrystalline layer 30 is etched, using the same mask, to define the bottom plate 12 of the capacitor 10 and the gate 28 of the FET 20 from layer 30. Both of these structures are illustrated in FIG. 6. The exposed portion of layer 32 over the gate 28, as well as the portion of layer 16 exposed on the edge of the top gate 14, may be selectively removed. Alternatively, the structure in FIG. 6 may be used as is. If the structure in FIG. 6 is used as is, connection to the bottom plate 12 and the gate 28 through the dielectric layer 32 and the exposed capacitor dielectric layer 16 would be part of the contact via metallization. For example, an isotropic etching or other selective etching may be used.

Figure 7:
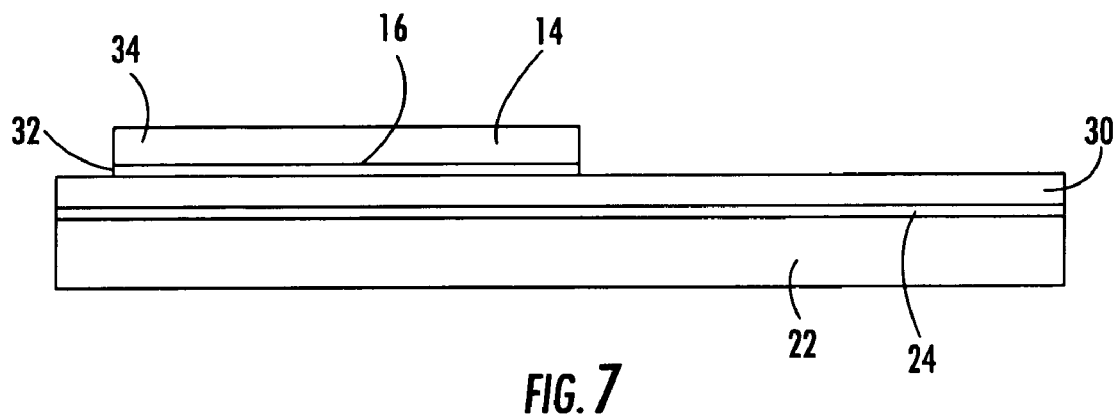
FIG. 7 is a cross-section showing a modified process step between FIGS. 4 and 5 of the first embodiment.

As an alternative to FIG. 5, the mask 40 which defines the top plate 14 may also be used to continue and selectively etch the dielectric layer 32 to define the dielectric layer 16 of the capacitor 10 to be co-existent with the top plate 14, as illustrated in FIG. 7. The mask 42 of FIG. 5 would then be used to define the bottom plate 12 and the gate 28 structure from layer 32. This would result in a structure that would look very similar to the integrated circuit of FIG. 1 of the prior art.

By applying all three layers which form the polycrystalline capacitor 10 and delineating the layers from the top on down. The occurrence of stringers at the bottom plate step is eliminated, and the exposure of the bottom plate 12 and dielectric 32 to intervening steps, other than their deposition and doping, is avoided.

It should also be noted that instead of using the mask 40, it may be removed, and the defined top plate 14 itself may be used as the mask to etch the dielectric layer 32 to form the capacitor dielectric layer 16. Also, since the dielectric layer 32 is not etched during the etching of the top layer 34, the etching process is more controlled and predictable and, therefore, increases the quality of the dielectric layer 16 of the capacitor 10. Similarly, with not exposing the gate oxide 24 to the processing of the layer 34 for the top plate 14 and for the dielectric layer 16, the quality of the gate oxide 24 of the FET 20 is also improved. After structure of FIG. 6 is completed, a top dielectric layer can be added and contacts etched to the top plate 34, the bottom plate 30, the substrate 22 and the gate 30.

Although the present disclosure has been described and illustrated in detail, it is to be clearly understood that this is done by way of illustration and example only and is not to be taken by way of limitation. The method was described for a polycrystalline capacitor, but it can be used to make any non-single-crystalline capacitor. The scope of the present disclosure is to be limited only by the terms of the appended claims.

What is claimed is:

1. A method of forming a capacitor in an integrated circuit, the method comprising:

forming a first non-single-crystalline layer on a gate dielectric layer on a surface of a substrate of an integrated circuit;

forming a capacitor dielectric layer on the first non-single-crystalline layer;

forming a second non-single-crystalline layer on the capacitor dielectric layer;

removing portions of the second non-single-crystalline layer to define a top plate of the capacitor;

forming a mask over the top plate and exposed portions of the capacitor dielectric layer with an opening;

etching using the mask to simultaneously remove portions of the capacitor dielectric layer and portions of the first non-single-crystalline layer to define a bottom plate of the capacitor after a top plate is defined on the gate dielectric layer.

2. The method according to claim 1, wherein portions of the first non-single-crystalline layer are removed to simultaneously define a gate of a transistor of the integrated circuit.

3. The method according to claim 1, including forming a mask over the second non-single-crystalline layer with an opening and etching to remove the portions of the second non-single-crystalline layer.

4. The method according to claim 1, subsequent to the masking and etching, using the top plate as a mask and etching to remove additional portions of the capacitor dielectric layer to define the dielectric of the capacitor.

5. The method according to claim 1, including forming a top dielectric layer over the defined first and second plates and the capacitor dielectric and forming contact vias to the first plate through the top dielectric and the capacitor dielectric and to the second plate through the top dielectric.

* * * * *